(12) United States Patent  
Yamane

(10) Patent No.: US 8,653,669 B2  
(45) Date of Patent: Feb. 18, 2014

(54) SEMICONDUCTOR PACKAGE

(71) Applicant: Oki Semiconductor Co., Ltd., Tokyo (JP)

(72) Inventor: Tae Yamane, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/860,072

(22) Filed: Apr. 10, 2013

(65) Prior Publication Data

US 2013/0221503 A1    Aug. 29, 2013

Related U.S. Application Data

(60) Continuation of application No. 13/423,306, filed on Mar. 19, 2012, now Pat. No. 8,436,480, which is a division of application No. 11/477,859, filed on Jun. 30, 2006, now Pat. No. 8,164,168.

(51) Int. Cl.  
 *H01L 23/48* (2006.01)

(52) U.S. Cl.  
 USPC ........... 257/773; 257/786; 257/797; 257/668; 257/E23.179

(58) Field of Classification Search  
 USPC .................. 257/773, 786, 797, 668, E23.179  
 See application file for complete search history.

(56) References Cited

U.S. PATENT DOCUMENTS

| | | | |
|---|---|---|---|
| 5,068,712 A | 11/1991 | Murakami et al. | |
| 5,072,281 A | 12/1991 | Eytcheson | |
| 5,343,074 A * | 8/1994 | Higgins et al. | 257/668 |
| 5,442,229 A * | 8/1995 | Mori et al. | 257/666 |
| 5,572,066 A * | 11/1996 | Safai et al. | 257/666 |
| 5,724,726 A | 3/1998 | Tomita et al. | |
| 5,825,081 A | 10/1998 | Hosomi et al. | |
| 5,949,134 A | 9/1999 | Yanagisawa | |
| 6,137,159 A | 10/2000 | Tsubosaki et al. | |
| 6,300,670 B1 | 10/2001 | Kramer et al. | |
| 6,851,100 B1 | 2/2005 | You et al. | |
| 7,061,078 B2 * | 6/2006 | Cheng | 257/666 |
| 7,183,660 B2 * | 2/2007 | Lee et al. | 257/786 |
| 2002/0171130 A1 * | 11/2002 | Takahashi et al. | 257/673 |
| 2003/0173663 A1 | 9/2003 | Kami et al. | |
| 2004/0178501 A1 | 9/2004 | Son et al. | |
| 2004/0262752 A1 * | 12/2004 | Ito et al. | 257/734 |
| 2005/0082647 A1 * | 4/2005 | Lee et al. | 257/668 |
| 2006/0199302 A1 | 9/2006 | Ito et al. | |

FOREIGN PATENT DOCUMENTS

| | | |
|---|---|---|
| JP | 62102536 | 5/1987 |
| JP | 10223678 | 8/1998 |
| JP | 2000-223802 | 8/2000 |
| JP | 2003249592 | 9/2003 |
| JP | 2005117036 | 4/2005 |
| JP | 2005167221 | 6/2005 |

* cited by examiner

*Primary Examiner* — Bilkis Jahan  
(74) *Attorney, Agent, or Firm* — Volentine & Whitt, PLLC

(57) ABSTRACT

A semiconductor package including a semiconductor chip; a base member on which the semiconductor chip is mounted; a plurality of leads formed on the base member, the leads including inner ends electrically connected to the semiconductor chip and outer ends; and an index for identifying locations of specific leads.

11 Claims, 11 Drawing Sheets

TCP

TCP

COF Package

COF Package

SEMICONDUCTOR PACKAGE

CROSS REFERENCE TO RELATED APPLICATIONS

This application is a Continuation Application of application Ser. No. 13/423,306, filed Mar. 19, 2012, which is divisional of U.S. non-provisional application Ser. No. 11/477,859, filed Jun. 30, 2006, now U.S. Pat. No. 8,164,168, issued Apr. 24, 2012, the disclosure of which is incorporated herein by reference in its entirety.

BACKGROUND OF THE INVENTION

1. Field of the Invention

The present invention relates to a semiconductor package, and more particularly to, a COF (Chip On Film) or TCP (Tape Carrier Package) type of LSI package.

2. Description of the Background Art

A conventional semiconductor package, such as TCP and COF types, includes a semiconductor chip; a polyimide tape; and conductive leads formed on the polyimide tape. The semiconductor chip is mounted on the polyimide tape and connected to inner ends of the leads.

For inspecting the semiconductor package, defective leads are detected and identified using a microscope. The locations of the defective leads are identified by the sequential order, for example, 215th from the right end. However, it is difficult to identify locations of leads, because leads are formed in a narrow pitch or interval. As a result; it takes a long time to inspect and analyze the semiconductor package.

SUMMARY OF THE INVENTION

Accordingly, an object of the present invention is to provide a semiconductor package in which locations of leads are easily identified.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS

According to a first aspect of the present invention, a semiconductor package includes a semiconductor chip; a base member on which the semiconductor chip is mounted; a plurality of leads formed on the base member, the leads including inner ends electrically connected to the semiconductor chip and outer ends; and an index for identifying locations of specific leads.

The base member may include a polyimide tape, a polyimide film and other types of insulating tapes or films. The leads may be formed on the base member directly or indirectly. The semiconductor chip, such as LSI, may be mounted on a base member or in a device hole of the base member.

According to a second aspect of the present invention, a method for inspecting a semiconductor package includes the steps of identifying locations of a specific lead based on the index; and inspecting the identified lead.

The inspection may be performed by observing an external appearance of the identified lead. The inspection may be performed by probing the identified lead for electrical inspection.

BRIEF DESCRIPTION OF THE DRAWINGS

FIG. 1 is a simplified plane view illustrating a TCP type of semiconductor package, the present invention is applicable to.

FIG. 3 is a simplified plane view illustrating a COF type of semiconductor package, the present invention is applicable to.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
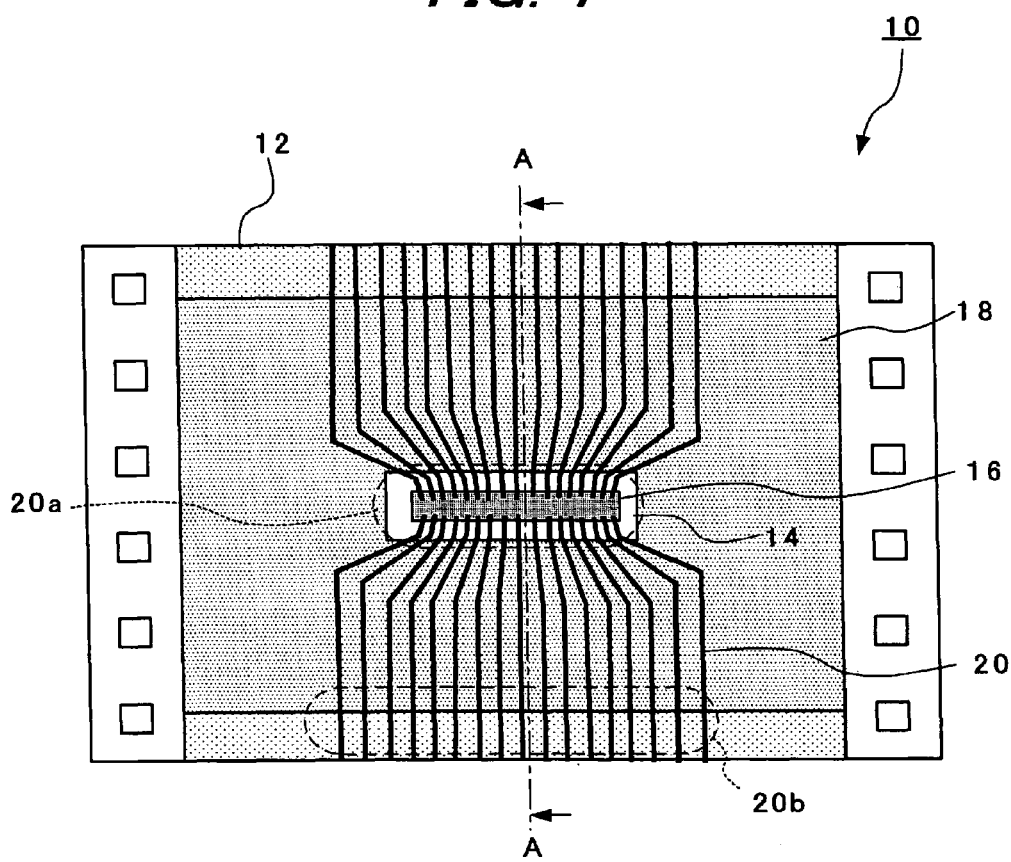
Figure 2:
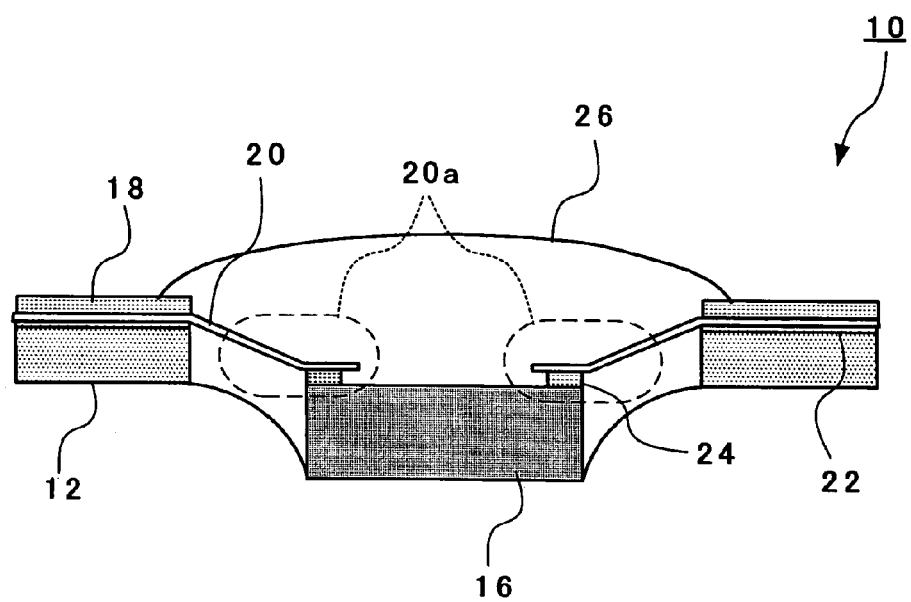
FIG. 2 is a cross sectional view, taken on line A-A in FIG. 1.

FIG. 1 is a simplified plane View illustrating a TCP type of semiconductor package, the present invention is applicable to. FIG. 2 is a cross sectional view, taken on line A-A in FIG. 1. A semiconductor package 10 includes a polyimide tape 12 (base member)having a device hole 14; a semiconductor chip 16 mounted in the device hole 14; leads 20 extending outwardly from the semiconductor chip 16; and a solder resist layer 18 formed over the polyimide tape 12. The solder resist 18 is formed to cover the leads 20 on the polyimide tape 12 so that outer ends of the leads 20 are exposed.

The semiconductor chip 16, for instance, is a driver IC or a driver LSI used for a display device. The leads 20 include an inner end portion 20a, which may be called "inner lead"

connected to the semiconductor chip 16. The leads 20 also include an outer end portion 20b, which may be called "outer lead" connected to an external device. The leads 20 are connected to the semiconductor chip 16 via Au (gold) bumps 24. The inner end portion 20a of the leads 20 are sealed with a resin 26.

The leads 20 are made from copper, covered and plated with tin (Sn). The leads 20 are formed onto the polyimide tape 12 via an adhesive 22.

Figure 3:
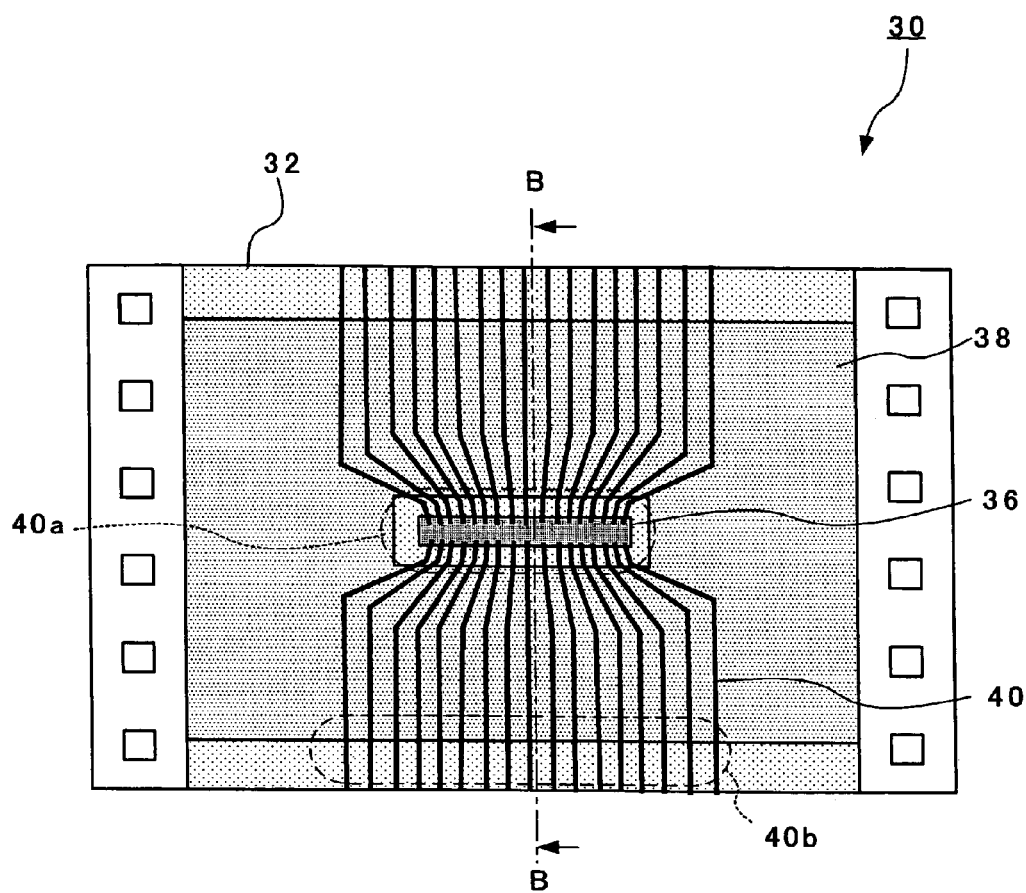
Figure 4:
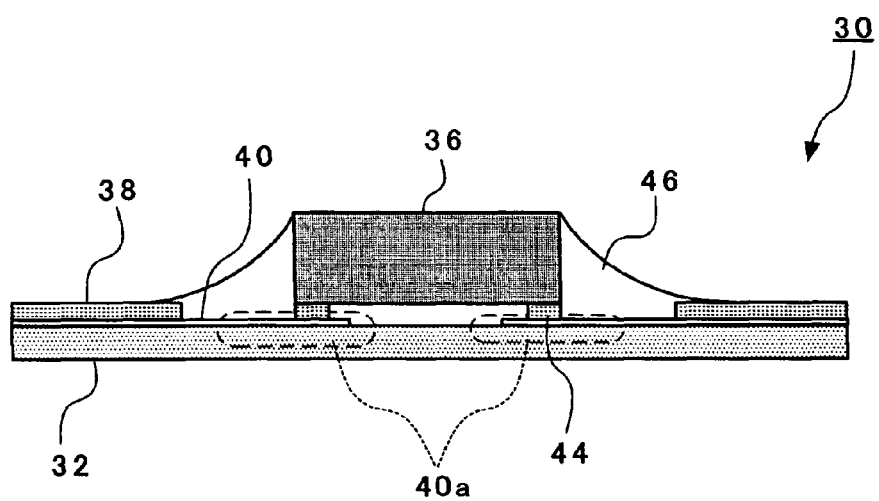
FIG. 4 is a cross sectional view, taken on line B-B in FIG. 3.

FIG. 3 is a simplified plane view illustrating a COF type of semiconductor package, the present invention is applicable to. FIG. 4 is a cross sectional view, taken on line B-B in FIG. 3. A semiconductor package 30 includes a polyimide tape 32 (base member); a semiconductor chip 36 mounted on the polyimide tape 32; leads 40 extending outwardly from the semiconductor chip 36; and a solder resist layer 38 formed over the leads 40. The solder resist 38 is formed to cover the leads 40 on the polymide tape 32 so that outer ends of the leads 40 are exposed.

The semiconductor chip 36, for instance, is a driver IC or a driver LSI used for a display device. The leads 40 include an inner end portion 40a, which may be called "inner lead" connected to the semiconductor chip 36. The leads 40 also include an outer end portion 40b, which may be called "outer lead" connected to an external device. The leads 40 are connected to the semiconductor chip 36 via Au (gold) bumps 44. The inner end portion 40a of the leads 40 are sealed with a resin 46. The leads 40 are made from copper, covered and plated with tin (Sn).

Figure 5:
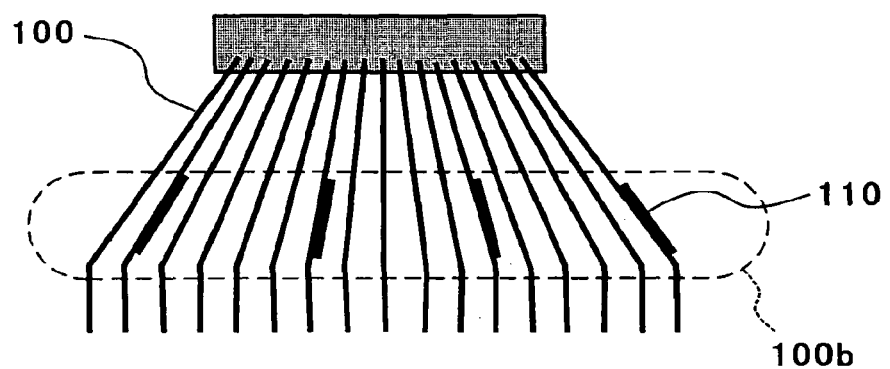
FIG. 5 is a diagram showing a simplified portion of a semiconductor package according to a first preferred embodiment of the present invention.

FIG. 5 is a diagram showing a simplified portion of a semiconductor package according to a first preferred embodiment of the present invention. A semiconductor package according to the first preferred embodiment includes leads 100 having outer end portions 100b. In or adjacent the outer end portions 100b, the leads 100 are shaped to have wider portions 110 as indices for identifying locations of leads 100.

For example, the wider portions 110 are formed on every tenth lead 100 so that specific leads can be easily found and identified. The wider portions 110 are formed in a patterning process for the leads 100. Preferably, the wider portions 110 are formed in or adjacent the outer portions 110b of the leads, because leads usually have wider space or clearance to the next leads. The embodiment can be applied both to COF and TCP types of semiconductor package.

Figure 6:
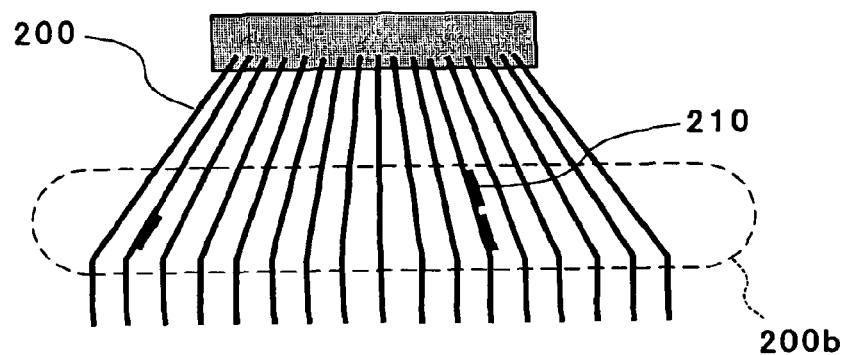
FIG. 6 is a diagram showing a simplified portion of a semiconductor package according to a second preferred embodiment of the present invention.

FIG. 6 is a diagram showing a simplified portion of a semiconductor package according to a second preferred embodiment of the present invention. A semiconductor package according to the second preferred embodiment includes leads 200 having outer end portions 200b. In or adjacent the outer end portions 200b, the leads 200 are shaped to have wider portions 210 as indices for identifying locations of leads 200.

As compared to the first preferred embodiment, shown in FIG. 5, the number of the wider portions 210 is changed for specific locations, for example, for every tenths tenth leads 200. In more detail, for instance, the tenth lead has a single wider portion 210 and the twentieth lead has two of wider portions 210. According to the second preferred embodiment, specific leads can be found and identified more easily than the first preferred embodiment.

In the same manner as the first preferred embodiment, the wider portions 210 are formed in a patterning process for the leads 200. Preferably the wider portions 210 are formed in or adjacent the outer portions 210b of the leads, because leads usually have wider space or clearance to the next leads. The embodiment can be applied both to COF and TCP types of semiconductor package.

Figure 7:
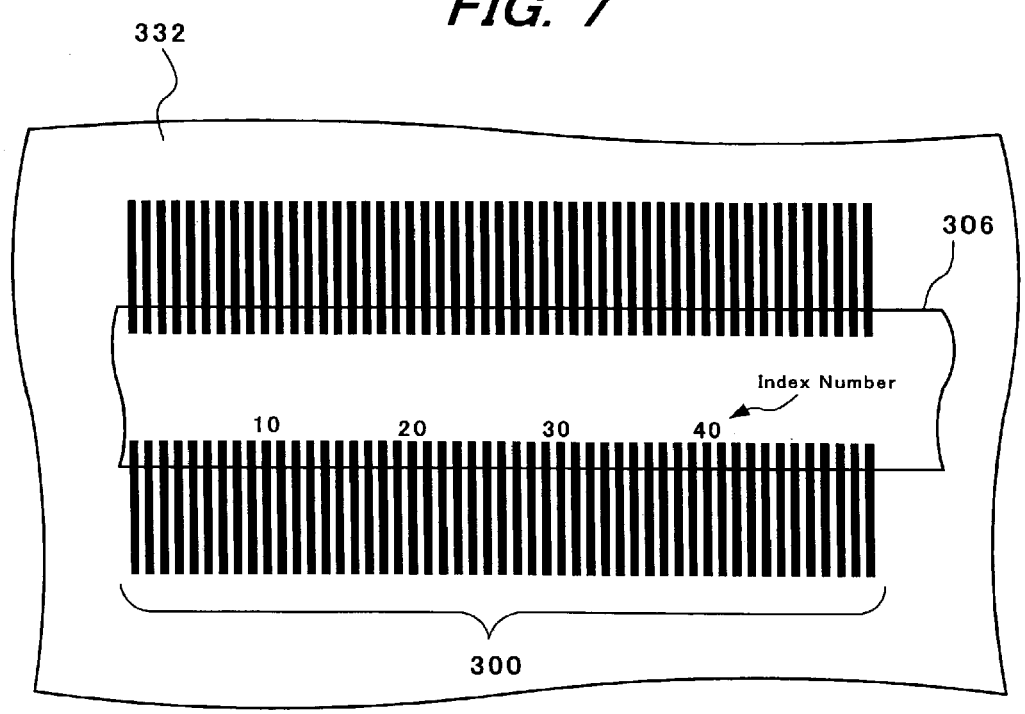
FIG. 7 is a diagram showing a simplified portion of a semiconductor package according to a third preferred embodiment of the present invention.

FIG. 7 is a diagram showing a simplified portion of a semiconductor package including semiconductor chip 306 according to a third preferred embodiment of the present invention. FIG. 7 corresponds to a view looking from a bottom surface of a base film in FIG. 4, but a sealing resin is not shown in FIG. 7. According to the third preferred embodiment, index numbers (10, 20 . . . ) are formed on a surface (upper surface) of a polyimide film 332 for identifying locations of leads 300. The index numbers are formed on the same surface of the polyimide film 332 as the leads 300.

The third preferred embodiment is preferably applied to a COF type of semiconductor package, because a thickness of the polyimide film 332 is usually small and the index numbers can be recognized through the polyimide film 332 from the other side. The index numbers may be formed in a process for forming the leads 300. The third preferred embodiment could be applied to a TCP type of semiconductor package, if the package uses a resin having a higher transparency.

According to the third preferred embodiment, specific leads can be found and identified more easily than the first and second preferred embodiment. Specific leads are identified based on the index numbers formed on the polyimide film 332.

Figure 8:
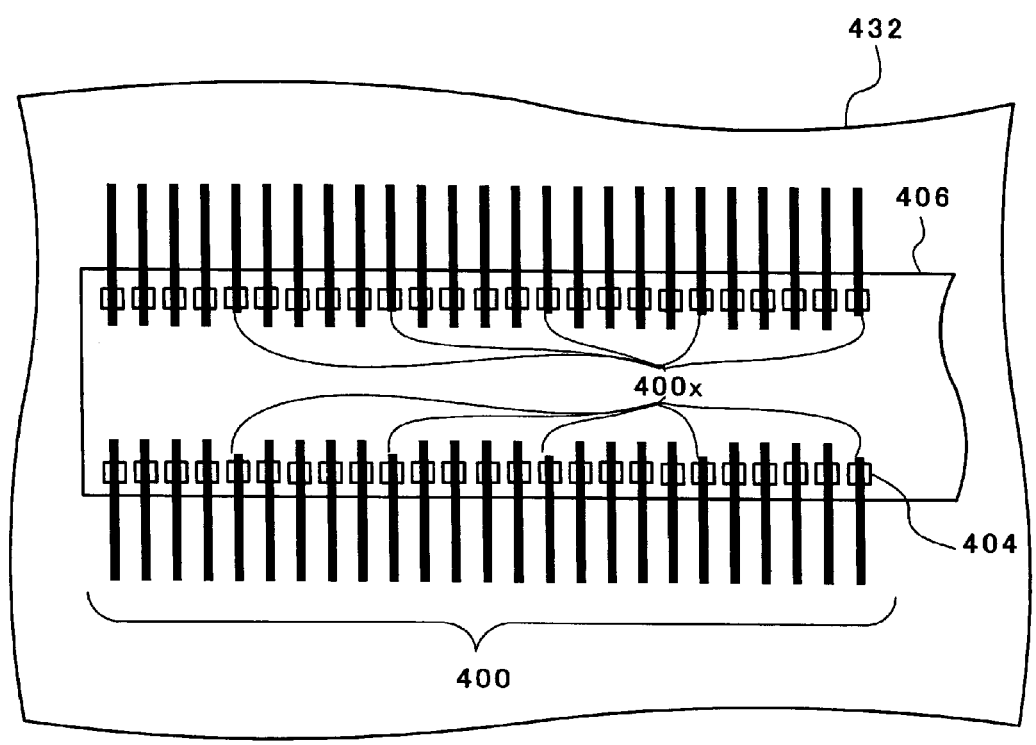
FIG. 8 is a diagram showing a simplified portion of a semiconductor package according to a fourth preferred embodiment of the present invention.

FIG. 8 is a diagram showing a simplified portion of a semiconductor package according to a fourth preferred embodiment of the present invention. FIG. 8 corresponds to a view looking from a bottom surface of a base film in FIG. 4 but a sealing resin is not shown in FIG. 8. According to the fourth preferred embodiment, leads 400 include index leads 400x having shorter inner ends. The leads 400 are formed on a surface (upper surface) of a polyimide film 432 and are connected to a semiconductor chip 406 via pads 404. The index leads 400x are designed to function as regular leads in the same manner as the other leads.

The index leads 400x are designed and patterned to have shorter inner ends, less extending inwardly from pads 404 than the others. The fourth preferred embodiment is preferably applied to a COF type of semiconductor package, because a thickness of the polyimide film 432 is usually small and the index leads 400x can be recognized through the polyimide film 432 from the other side. The fourth preferred embodiment could be applied to a TCP type of semiconductor package, if the package uses a resin having a higher transparency.

According to the fourth preferred embodiment, specific leads can be found and identified easily based on the index leads 400x.

Figure 9:
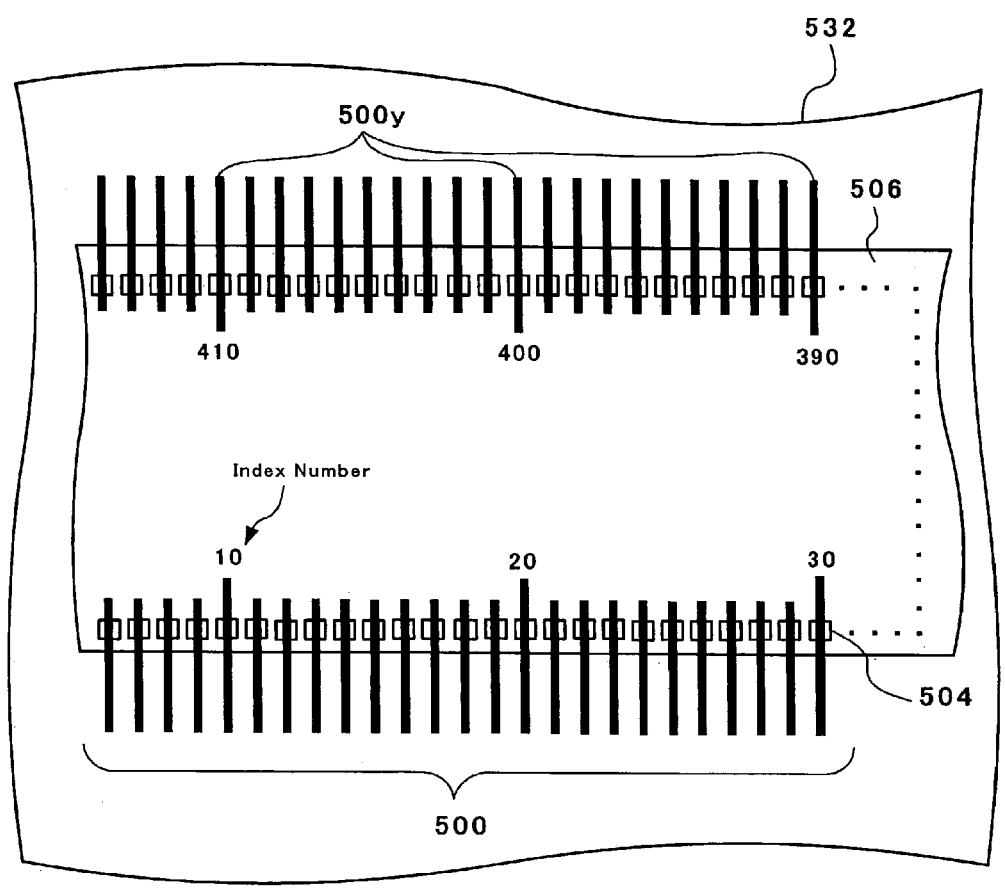
FIG. 9 is a diagram showing a simplified portion of a semiconductor package according to a fifth preferred embodiment of the present invention.

FIG. 9 is a diagram showing a simplified portion of a semiconductor package according to a fifth preferred embodiment of the present invention. FIG. 9 corresponds to a view looking from a bottom surface of a base film in FIG. 4 but a sealing resin is not shown in FIG. 9. It could be said that the fifth preferred embodiment includes both the features of the third and fourth preferred embodiments, shown in FIGS. 7 and 8.

In the same manner as the third preferred embodiment, index numbers (10, 20 . . . ) are formed on a surface (upper surface) of a polyimide film 532 for identifying locations of leads 500. The index numbers are formed on the same surface of the polyimide film 532 as the leads 500. Further, similarly to the fourth preferred embodiment, the leads 500 include index leads 500y, which are designed and patterned to have longer inner ends, more extending inwardly from pads 504 than the others.

The index numbers are numbered sequentially, for example in FIG. 9, counterclockwise of "left bottom corner"—"right bottom corner"—"right top corner" to "left top corner". The index numbers can be numbered non-sequentially among the top side, bottom side, right side and left side.

According to the fifth preferred embodiment, leads 500 include index leads 500y having longer inner ends. The leads 500 are formed on a surface (upper surface) of a polyimide film 532 and are connected to a semiconductor chip 506 via pads 504. The index leads 500y are designed to function as regular leads in the same manner as the other leads.

The fifth preferred embodiment is preferably applied to a COF type of semiconductor package, because a thickness of the polyimide film 532 is usually small and the index numbers and the index leads 500y can be recognized through the polyimide film 532 from the other side. The fifth preferred embodiment could be applied to a TCP type of semiconductor package, if the package uses a resin having a higher transparency.

Figure 10:
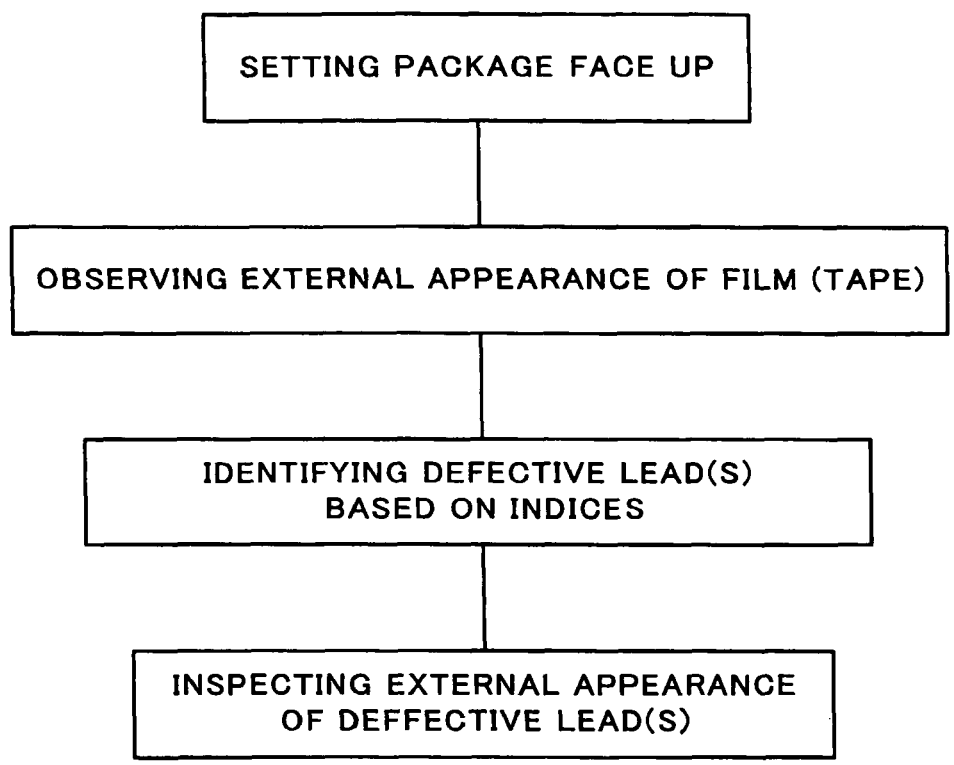
FIG. 10 is a flow chart showing simplified steps for analyzing a semiconductor package according to the present invention.

FIG. 10 is a flow chart showing simplified steps for analyzing a semiconductor package according to the present invention. First, a semiconductor package is set to a microscope so that a semiconductor chip faces up. For example, in the case of the semiconductor package 30 shown in FIGS. 3 and 4, the polyimide film 32 faces up. After that, an external appearance of the base film is observed and inspected.

Subsequently, defective leads are identified based on the indices (110, 210, 400x, 500y or index numbers). After that, an external appearance of the defective leads is inspected and causes of the defects are investigated.

Figure 11:
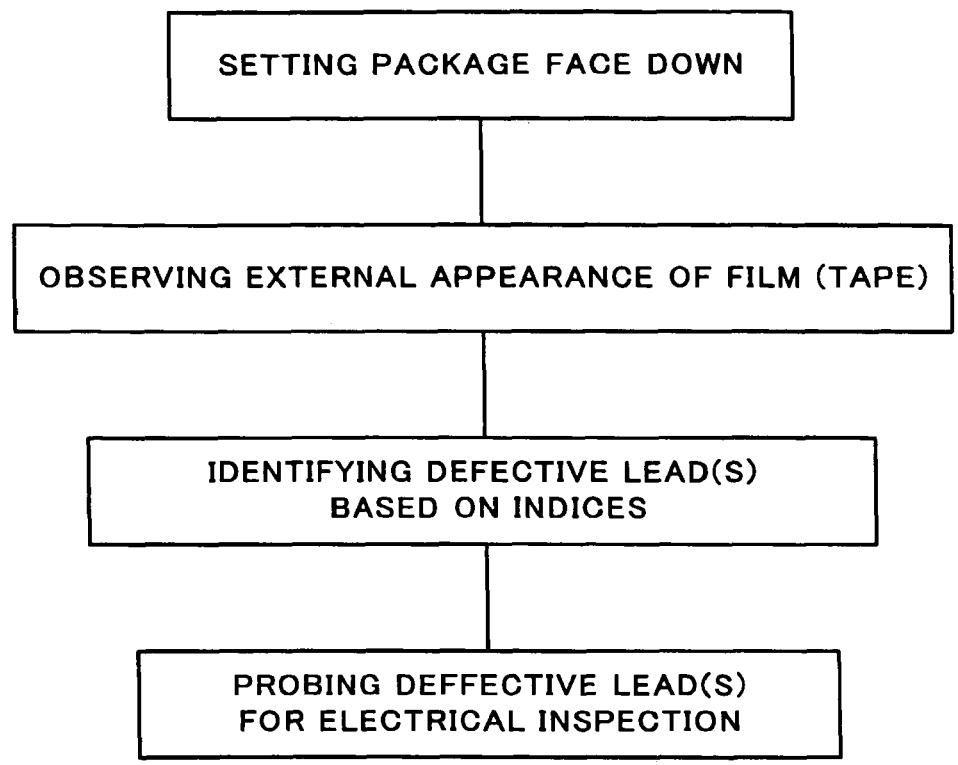
FIG. 11 is a flow chart showing simplified steps for analyzing a semiconductor package according to the present invention.

FIG. 11 is a flow chart showing simplified steps for analyzing a semiconductor package according to the present invention. First, a semiconductor package is set to a microscope so that a semiconductor chip faces down. For example, in the case of the semiconductor package 30 shown in FIGS. 3 and 4, the polyimide film 32 faces down. After that, an external appearance of the base film is observed and inspected.

Subsequently, defective leads are identified based on the indices (110, 210, 400x, 500y or index numbers). After that, a probing test is carried out to the defective leads for electrical inspection and causes of the defects are investigated.

What is claimed is:

1. A semiconductor device, comprising:
    a semiconductor chip having a first side and a second side opposite the first side;
    a plurality of electrode pads disposed on the semiconductor chip along the first side;
    a base member on which the semiconductor chip is mounted; and a first index lead, a second index lead and a plurality of inner leads disposed on the base member, the inner leads being arranged between the first index lead and the second index lead, and the first index lead, the second index lead and the inner leads being electrically connected with the electrode pads of the semiconductor chip across the first side of the semiconductor chip,
    wherein a first distance between ends of the first and second index leads and the first side is longer than a second distance between each of ends of the inner leads and the first side, and
    wherein all ends of the inner leads are coincident with a line which is in parallel to the first side.

2. The semiconductor device according to the claim 1, wherein the first and second index leads are longer than the inner leads.

3. The semiconductor device according to the claim 1, wherein the first index lead, the second index lead and the inner leads are electrically connected with the electrode pads of the semiconductor chip via aurous bumps.

4. The semiconductor device according to the claim 1, wherein a number of the inner leads is nine.

5. The semiconductor device according to the claim 1, wherein the base member is a polyimide tape.

6. The semiconductor device according to the claim 1, wherein the base member is a COF (Chip On Film).

7. The semiconductor device according to the claim 1, further comprising:
    a solder resist disposing on the base member to cover the first index lead, the second index lead and the inner leads around the semiconductor chip.

8. The semiconductor device according to the claim 1, wherein the first index lead, the second index lead and the inner leads are arranged at even intervals.

9. The semiconductor device according to the claim 1, further comprising:
    a plurality of other inner leads disposed on the base member, the other inner leads being arranged opposite the inner leads on the basis of the second index lead.

10. The semiconductor device according to the claim 1, wherein the first index lead, the second index lead and the inner leads are made from copper.

11. The semiconductor device according to the claim 10, wherein the first index lead, the second index lead and the inner leads are covered with tin.

* * * * *